(12) United States Patent
Kakugawa et al.

(10) Patent No.: US 7,292,040 B2
(45) Date of Patent: *Nov. 6, 2007

(54) SPLIT TYPE NMR SUPERCONDUCTIVE MAGNET DEVICE AND NMR APPARATUS FOR SOLUTION ANALYSIS WITH DIFFERENT CURRENT DIRECTIONS AND A PERMANENT CURRENT SWITCH

(75) Inventors: Shigeru Kakugawa, Hitachi (JP); Michiya Okada, Mito (JP); Katsuzou Aihara, Hitachiohta (JP); Hiroshi Morita, Hitachi (JP); Tsuyoshi Wakuda, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/489,593

(22) Filed: Jul. 20, 2006

(65) Prior Publication Data

US 2006/0250134 A1   Nov. 9, 2006

Related U.S. Application Data

(63) Continuation of application No. 11/348,347, filed on Feb. 7, 2006, now Pat. No. 7,154,271, which is a continuation of application No. 11/078,360, filed on Mar. 14, 2005, now Pat. No. 7,053,621, which is a continuation of application No. 10/430,340, filed on May 7, 2003, now abandoned.

(30) Foreign Application Priority Data

May 8, 2002   (JP) ............................. 2002-132255

(51) Int. Cl.
   *G01V 3/00*   (2006.01)

(52) U.S. Cl. ....................... 324/319; 324/318; 324/321

(58) Field of Classification Search ........ 324/318–322, 324/307, 309
See application file for complete search history.

(56) References Cited

U.S. PATENT DOCUMENTS

| | | |
|---|---|---|
| 4,180,769 A | 12/1979 | Gang |
| 4,822,772 A | 4/1989 | Huson |
| 5,168,211 A | 12/1992 | Laukien |
| 5,198,769 A | 3/1993 | Frese |
| 5,235,282 A | 8/1993 | Overweg |
| 5,359,310 A | 10/1994 | Pissanetzky |
| 5,414,360 A | 5/1995 | Westphal |
| 5,485,088 A | 1/1996 | Westphal |
| 5,534,779 A | 7/1996 | Young |

(Continued)

*Primary Examiner*—Diego Gutierrez
*Assistant Examiner*—Tiffany A Fetzner
(74) *Attorney, Agent, or Firm*—Antonelli, Terry, Stout & Kraus, LLP.

(57) ABSTRACT

A superconducting magnet configured for an NMR spectrometer includes a split type superconducting magnet having left solenoid superconducting magnets and right solenoid superconducting magnets with a center space therebetween for receiving a sample tube. A permanent current switch is provided and the left and right solenoid superconducting magnets are arranged symmetrically with respect to a center face of the center space. The left and right solenoid superconducting magnets are constituted by an outermost magnet and a plurality of innermost magnets and are arranged in concentric relation with respect to a vertical axis of the center space. A direction of current in at least one of the plurality of innermost magnets is minus when a direction of current in the outermost magnet is plus.

9 Claims, 10 Drawing Sheets

U.S. PATENT DOCUMENTS

| | | |
|---|---|---|
| 5,545,997 A | 8/1996 | Westphal |
| 5,565,778 A | 10/1996 | Brey |
| 5,594,342 A | 1/1997 | Brey |
| 5,619,140 A | 4/1997 | Brey |
| 5,708,362 A | 1/1998 | Frese |
| 5,813,319 A | 9/1998 | Lee |
| 5,986,453 A | 11/1999 | Anderson |
| 6,054,855 A | 4/2000 | Anderson |
| 6,369,464 B1 | 4/2002 | Schauwecker |
| 6,556,013 B2 | 4/2003 | Withers |
| 6,580,346 B1 | 6/2003 | Takeshima |
| 6,707,359 B2 | 3/2004 | Yoshida |
| 6,842,004 B2 | 1/2005 | Withers |
| 6,847,279 B2 | 1/2005 | Yoshida |
| 6,861,933 B1 | 3/2005 | Yoshida |
| 6,888,352 B2 | 5/2005 | Okada |
| 6,897,657 B2 | 5/2005 | Okada |
| 6,937,019 B2 | 8/2005 | Okada |
| 6,975,118 B2 | 12/2005 | Okada |
| 7,026,817 B2 | 4/2006 | Okada |
| 7,046,007 B2 * | 5/2006 | Okada et al. ............... 324/321 |
| 7,053,621 B2 * | 5/2006 | Kakugawa et al. ......... 324/319 |
| 7,154,271 B2 * | 12/2006 | Kakugawa et al. ......... 324/318 |
| 7,190,167 B2 * | 3/2007 | Okada et al. ............... 324/321 |
| 2003/0011456 A1 | 1/2003 | Yoshida |
| 2003/0052682 A1 | 3/2003 | Withers |
| 2003/0076103 A1 | 4/2003 | Okada |
| 2003/0076104 A1 | 4/2003 | Okada |
| 2003/0210052 A1 | 11/2003 | Okada |
| 2004/0032262 A1 | 2/2004 | Withers |
| 2004/0041565 A1 | 3/2004 | Kakugawa |
| 2004/0046556 A1 | 3/2004 | Okada |
| 2004/0051613 A1 | 3/2004 | Yoshida |
| 2005/0122114 A1 | 6/2005 | Okada |
| 2005/0189944 A1 | 9/2005 | Okada |
| 2005/0248349 A1 | 11/2005 | Okada |
| 2005/0253586 A1 | 11/2005 | Kakugawa |
| 2006/0125478 A1 * | 6/2006 | Kakugawa et al. ......... 324/321 |
| 2006/0186886 A1 * | 8/2006 | Okada et al. ............... 324/321 |
| 2006/0250134 A1 * | 11/2006 | Kakugawa et al. ......... 324/321 |

* cited by examiner

SPLIT TYPE NMR SUPERCONDUCTIVE MAGNET DEVICE AND NMR APPARATUS FOR SOLUTION ANALYSIS WITH DIFFERENT CURRENT DIRECTIONS AND A PERMANENT CURRENT SWITCH

CROSS REFERENCE TO RELATED APPLICATION

This is a continuation of U.S. application Ser. No. 11/348,347 filed Feb. 7th 2006 now U.S. Pat. No. 7,154,271 B2 issued Dec. 26th 2006, which is a continuation of U.S. application Ser. No. 11/078,360 filed Mar. 14th 2005 now U.S. Pat. No. 7,053,621 B2 issued May 30th 2006, which is a continuation of U.S. application Ser. No. 10/430,340, filed May 7, 2003 now ABANDONED, the contents of which are incorporated herein by reference.

BACKGROUND OF THE INVENTION

The present invention relates to a nuclear magnetic resonance analyzing apparatus; and, more particularly, the invention relates to a magnet device for generating a uniform magnetic field.

Rapid progress has recently been made in the field of organic analysis using nuclear magnetic resonance. In particular, atomic structures of organic compounds, such as proteins, can now be efficiently analyzed by the combined use of nuclear magnetic resonance and superconducting ferromagnetic technology.

An object of the present invention is to provide an NMR spectrometer which is necessary for analyzing atomic structures and interactions of protein molecules in a solution (the solution is prepared by dissolving minute amounts of proteins into a liquid). The NMR spectrometer of the present invention is a special energy spectrometer, which is different from a medical MRI diagnosing apparatus having an image resolution in the order of a millimeter, of the type used for human tomography. Such a special energy spectrometer must have a magnetic field intensity which is higher than that of the typical medical MRI diagnosing apparatus by one digit, a magnetic field uniformity which is higher than that of the medical MRI diagnosing apparatus by four digits, and a stability which is higher than that of the typical medical typical MRI diagnosing apparatus by three digits; and, the design engineering and manufacturing technology thereof are totally different from those of the typical medical MRI diagnosing apparatus.

Details of the conventional high-resolution nuclear magnetic resonance analyzing apparatuses can be found in "NMR of Proteins", which was written by Yohji Arata and published by Kyoritsu Shuppan in 1996. Recent publications relating to typical equipment components to be utilized for applying NMR to protein analysis include: Japanese Patent Laid-open No. 2000-147082, which discloses a development relating to a superconducting magnet, i.e., multilayer air-core solenoid coils; U.S. Pat. No. 6,121,776, which discloses a birdcage superconducting detection coil; Japanese Patent laid-open Nos. 2000-266830 and 6-237912, each of which discloses a signal detection technique using a conventional saddle-like coil or a birdcage coil; and so forth.

According to the above-listed publications, all of the conventional high sensitivity nuclear magnetic resonance analyzing apparatuses for protein analysis include a superconducting magnet device which uses solenoid coils that are combined so as to generate a magnetic field in a vertical direction, thereby irradiating a sample with an electromagnetic wave of 400 to 900 MHz so as to detect a resonance waveform produced from the sample by the use of a saddle-like or birdcage detection coil. In some cases, the S/N parameter is improved by the use of a detector which is cooled to a low temperature in order to reduce the thermal noise in the detection of signals, as disclosed in the above-mentioned United States Patent.

Figure 8:
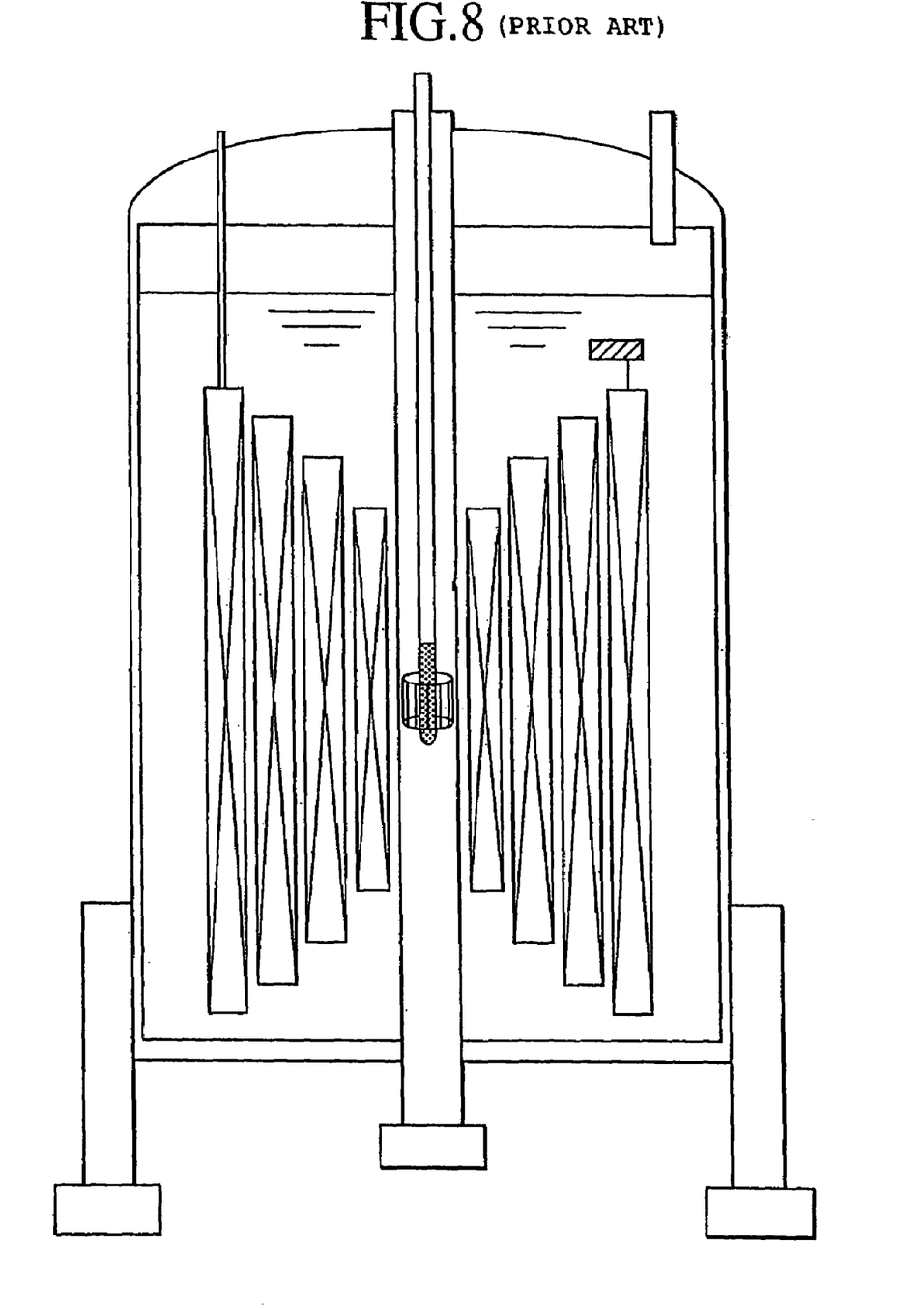
FIG. 8 is a sectional view schematically showing a conventional NMR apparatus.
Figure 9:
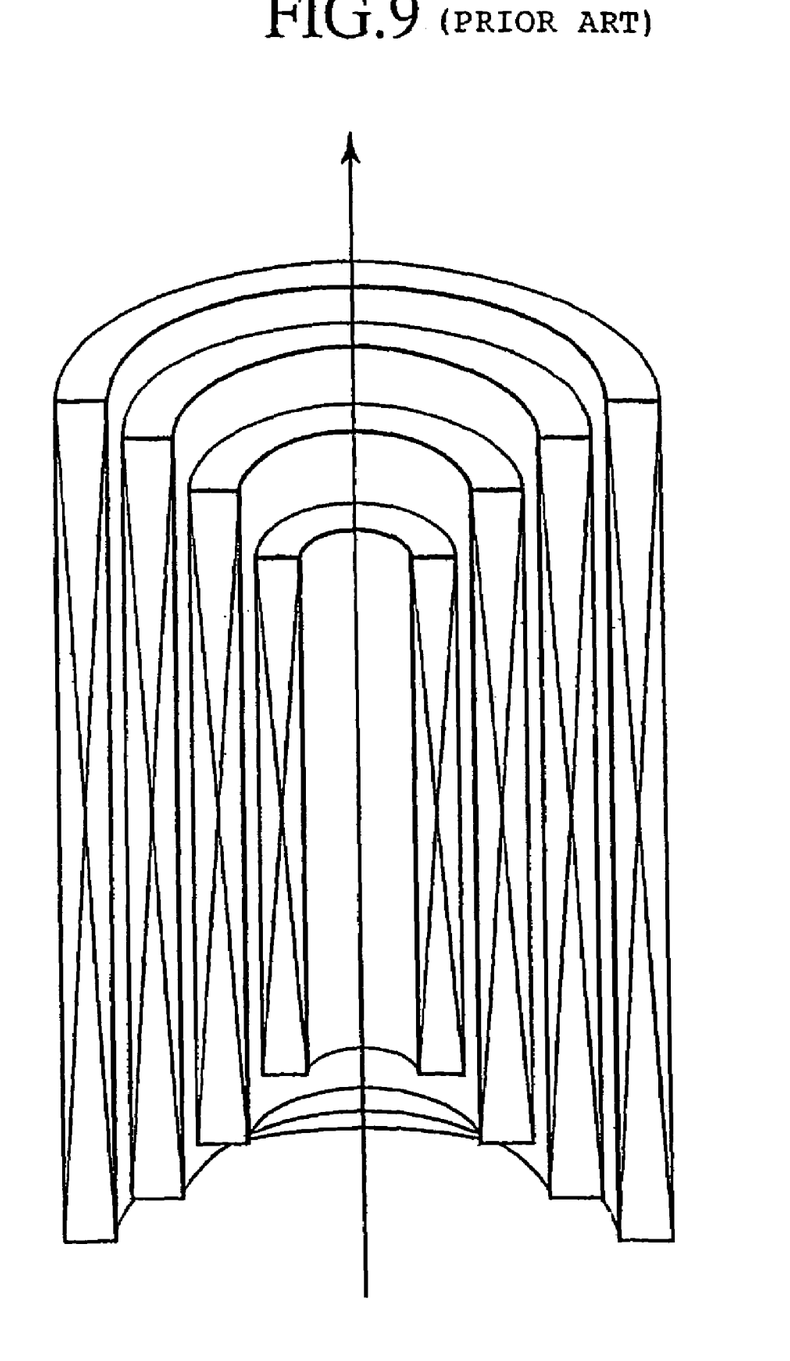
FIG. 9 is a sectional perspective view showing superconducting coils constituting the conventional NMR apparatus.

In the past, the sensitivity of high sensitivity nuclear magnetic resonance apparatuses has been improved through the use of methods of improving the intensity at the center portion of the magnetic field of the superconducting magnet, without changing the basic system structure of the apparatus, including an antenna, a magnet, and so forth. Therefore, although the maximum NMR detection sensitivity, which has heretofore been reported, was achieved by an NMR apparatus of 900 MHz, which uses a large superconducting magnet, such as shown in of FIG. 8, having a center magnetic field intensity of 21.1 Tesla, the basic structure of the NMR apparatus is not any different from that disclosed in Japanese Patent Laid-open No. 2000-147082. For better understanding of the basic structure, a sectional perspective view of the superconducting coils of the NMR apparatus is shown in FIG. 9, wherein a virtual central axis is indicated. In protein analysis using a solution, an increase in the intensity at the magnetic field center has the effects of improving the sensitivity and clarifying the separation of a chemical shift.

The sensitivity improving effects, which depend on the shapes of the detection coils, are mentioned on page 326 of "Book of NMR", which was written by Yohji Arata and published by Maruzen in 2000, where the solenoid coil is indicated as being advantageous as compared with the saddle-like coil or the birdcage coil in various aspects, as described below.

For example, the solenoid coil is superior in controllability of impedance, filling factor, and RF magnetic field efficiency. According to the "Book of NMR", however, it is actually impossible to wind solenoid coils around a sample tube which is placed perpendicularly with respect to the magnetic field in the conventional superconducting magnet structure; and, in general, the solenoid coil has not been used in cases where the sensitivity is crucial, such as a case of determining a minute amount of protein dissolved in a solution. For a particularly exceptional case wherein the solenoid coil is used for determining a minute amount of sample solution with high sensitivity, a method which employs a specially designed micro sample tube and a probe combined with the solenoid coil is known.

As a particular example, a method wherein a high-temperature superconducting bulk magnet is magnetized in the horizontal direction, so as to detect NMR signals using a solenoid coil, is disclosed in Japanese Patent Laid-open No. 11-248810. Japanese Patent Laid-open No. 7-240310 discloses the structures of a superconducting magnet and a cooling container that are suitably used for a typical NMR apparatus for eliminating a restriction in the height of the apparatus. However, a method of achieving the detection sensitivity which is required for analyzing proteins, and techniques for controlling the uniformity and the time stability of a magnetic field, have not yet been proposed.

SUMMARY OF THE INVENTION

Recently, the need for analysis of samples which contain proteins, each having a low solubility in water, has grown with the increase in the need for investigations of proteins, and such a growing need has brought about the necessity of improving the sensitivity for detecting NMR. In order to adapt a nuclear magnetic resonance analyzing apparatus for the needs described above, it is necessary to improve the detection sensitivity, without increasing the size of the sample space as compared with conventional apparatuses and, further, it is mandatory to provide stability in a superconducting magnetic field for a long period of data integration. The improved sensitivity contributes not only to the reduction in detection time, but also to the reduction in sample amount, thereby achieving the effect of enabling the analysis of proteins having a low solubility to liquids. Thus, it is required that the NMR analyzing apparatus, which is to be used for the protein analysis, have a particularly superior detection sensitivity and stability as compared with the conventional ones, and accurate and stable NMR signal detection over a long period of time, such as a week or more, must be assured. This is because a fluctuation in the magnetic field during the detection causes a peak of the NMR signals to move, and such movement of the peak in detection of an interaction can be confused with movement of a peak caused by the interaction or by an unstable magnetic field. Further, if the magnetic field is non-uniform, desired peaks are overlapped to cause problems, such as difficulty in distinguishing the interaction. Thus, the future NMR technology to be used for the purpose of analyzing proteins must be a novel technology, which involves more than a simple modification of the conventional NMR apparatuses.

For example, the specifications for a uniformity of a magnetic field provided in a typical NMR apparatus are 0.01 ppm in a sample space and 0.01 ppm/h by time stability. If this magnetic field is used in a typical proton NMR apparatus of 600 MHz, the allowable error is 6 Hz. However, for the analysis of interactions of proteins, the required space and time resolutions are not more than 1.0 Hz, preferably not more than 0.5 Hz.

The superconducting magnet and the detection coil must be optimized so as to achieve the above-identified uniformity and time stability in the magnetic field. Therefore, the performances of the conventional NMR apparatuses are insufficient, and the required stability and uniformity are greater than those achieved by the conventional NMR apparatuses by one digit or more.

Since the improvements in sensitivity of the conventional NMR apparatuses have been achieved by intensifying the magnetic field, the apparatuses have become too large. Since a dedicated room was required for the apparatuses in view of the leakage magnetic field and the floor strength, problems such as poor installability have arisen. Also, an increase in the cost of the superconducting magnet has been problematic. Further, in the improvement in sensitivity achieved by the conventional technique, the intensity has reached to its upper limit of 21 T due to the restriction caused by the critical magnetic field of the superconducting material. Therefore, in order to achieve a further improvement in sensitivity, there has been a demand for a new technique for improving the detection sensitivity which does not rely on the magnetic field intensity.

High-sensitivity detection using a solenoid coil can be realized by the use of a special sample tube which contains a minute amount of a sample and a special detection probe, as mentioned above; however, the high-sensitivity detection method is not suitable for analyzing a protein solution that is as little as about 10 cc. Further, according to the technique, wherein a magnetic field is generated in the horizontal direction by the use of a ferromagnetic member and NMR signals are detected by the use of the solenoid coil, which is disclosed in Japanese Patent Laid-open No. 11-248810, a magnetic field that is less than 10 T is generated on the surface of the high temperature superconductor, while the magnetic field near the sample has an intensity of several teslas at most. Therefore, it is impossible to achieve a magnetic field of 11 T or more, preferably 14.1 T or more, which is required for protein analysis in a desired sample space, through the use of the technology disclosed in Japanese Patent Laid-open No. 11-248810.

Further, the technique disclosed in Japanese Patent Laid-open No. 11-248810 involves a difficulty in achieving a time stability of 1.0 Hz/time or less, which is required for protein analysis, due to the magnetic flux creep of the superconductors. Further, this technique also involves a difficulty in achieving a magnetic field uniformity of 1.0 Hz or less in the proton nuclear magnetic resonance frequency, which is required for protein analysis, in a space having a diameter of 10 mm and a length of 20 mm, since there is a non-uniformity derived from the process of manufacture of the material of the superconducting bulk magnet.

Thus, break-through developments in the technology to fit the requirements for protein analysis are in demand, while an improvement in the sensitivity achieved by increasing the magnetic field intensity has reached its limit. Therefore, a novel technique for further improvement the in sensitivity has been in demand.

To provide efficient, accurate analysis of the interactions of proteins with low molecular weight molecules, such as a substrate and ligand in a solution, for which the need will hereafter increase, it is desirable that the analysis be conducted by using an appropriate amount of sample with a frequency of 600 to 900 MHz and an intensity at the magnetic field center of about 14 to 21 T, and that the detection sensitivity and throughput be increased.

In general, in an apparatus of 800 MHz or more, liquid helium of 4.2 K is depressurized and supercooled to 1.8 K in order to exploit the superconductivity to the utmost. Therefore, the operation of the apparatus is complicated and very careful maintenance therefor is necessary.

Further, since the leakage magnetic field is increased with an increase in the size of the magnetic device, a dedicated room is usually required for the conventional NMR apparatus. In particular, from the standpoint of the installability of the apparatus, the conventional magnetic device has a problem of a leakage magnetic field which is increased in the vertical direction with an increase in the intensity at the magnetic field center. For example, since the conventional class 900 MHz magnet device generates a leakage magnetic field as long as 5 m in height, a room having a considerable ceiling height is required.

Thus, the conventional magnet device has the problem of increased cost for installation. In addition, the magnet portion of the conventional 900 MHz superconducting magnet has a diameter of 1.86 m and a height of a several meters, as is disclosed in "IEEE. Transactions on Applied Superconductivity, Vol. 11, No. 1, p. 2438".

An object of the present invention is to provide a novel nuclear magnetic resonance analyzing apparatus in which the detection sensitivity of NMR signals is improved by 40% or more at a frequency of 600 MHz (14.1 T) with respect to the conventional apparatuses in a state where an ordinary sample tube having a diameter of 5 to 10 mm and containing a sample solution of 30 mm is placed therein, and in which a time stability and a space uniformity of the superconducting magnet required for protein analysis are provided. The present invention not be assumed to limit the operation temperature to 4.2 K in structure. It is possible to realize the ultimate performance through the application of the present invention; and, depending on the mode of the application, the apparatus of the present invention may be operated with the conventional upper limit magnetic field intensity of 21.1 T, i.e., 900 MHz and 1.8 K. In this case, the apparatus of the present invention is able to exhibit an improved sensitivity by 40% as compared with the conventional apparatuses, thereby advancing the upper limit of the detection sensitivity for the first time in the art.

The inventors of the present invention have conducted intensive studies to discover problems in the conventional nuclear magnetic resonance apparatuses and solutions thereto. Since the existing nuclear magnetic resonance apparatuses have been developed from the standpoint of both cost and installability, NMR signals produced from a solution sample placed at the center portion of multilayer air-core solenoid coils having an excellent magnetic field uniformity have been detected by the use of a saddle-like or birdcage antenna. In the past, with the development in NMR technology attained by the progress achieved in the detection technique and the analysis method, the detection sensitivity has been improved through the enhancement of the intensity at the magnetic field center from a magnetic field intensity of less than 400 MHz without changing the basic structure. Further, use of the superconducting birdcage antenna for the reduction of thermal noise has recently been proposed. The inventors have conducted intensive studies on a technique for remarkably enhancing the signal intensity without changing the magnetic field intensity. As a result, we have found that the novel structure described below can solve the problems described above.

The present invention enables an improvement in the sensitivity by using a solenoid detection coil having a diameter of about 5 to 10 mm and a height of about 20 mm, with which an ordinary sample tube for NMR investigations can be used, in a sample space having a diameter of 5 to 10 mm and in a magnetic field of not less than 400 MHz, preferably about 600 to 900 MHz, which is suitable for a solution NMR of a height of 20 mm.

In theory, it is expected that the sensitively of 1.4 ($\sqrt{2}$) times that achieved by the conventional devices is achieved by the shape of the coil, and further improvement is expected by other factors. Also, the data integration time can be shortened to not more than half that of the conventional devices. A sample tube having a diameter of 5 to 10 mm is charged with a liquid sample until it reaches a height of 20 to 30 mm, and then it is inserted into the apparatus from above along the vertical direction. In order to detect the NMR signals with high sensitivity by use of the solenoid coil which is wound about a vertical axis, it is necessary to magnetize a magnetic field to be generated by the superconducting magnet in the horizontal direction and to make it possible to place the solution sample, which can readily be attached and removed, at the center portion of the magnetic field.

Figure 10:
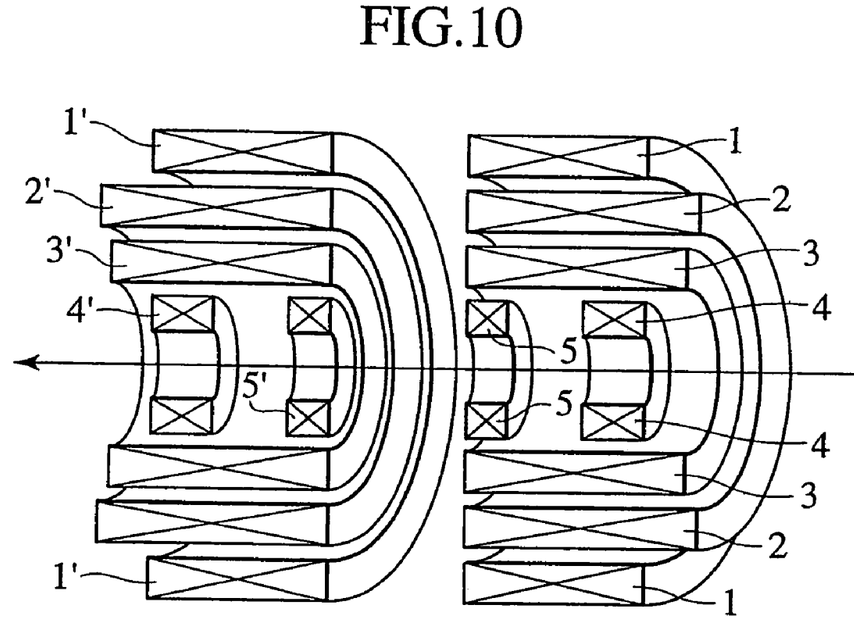
FIG. 10 is a sectional perspective view showing coils of a split type magnet device according to an embodiment of the present invention.

Therefore, the structure of the superconducting magnet device of the present invention is different from that of the conventional devices which use a simple solenoid magnet, and, thereby, it is necessary that the superconducting magnet be a split type magnet having a pair of left and right magnet portions. It is necessary that the magnet to be used for the NMR apparatus generate a magnetic field of ppb-order uniformity in the sample space, as mentioned above. A technique for achieving such uniformity of the magnetic field using the high magnetic field split type magnet of 14.1 T has not been proposed in the art. As shown in FIG. 10, the present invention is characterized in that a current conveyed by coils constituting the innermost layer, among two sets of multilayer coils facing each other with a predetermined spacing, flows in a direction reverse from that of the main magnetic field.

Referring to FIG. 10, the arrow indicated in FIG. 10 is a virtual central axis of coils 1 to 5 and 1' to 5' constituting the magnet. Since each of the coils is wound around a spool, which is not shown in FIG. 10, a section thereof typically has a substantially rectangular shape, as shown in FIG. 10. Also, in order to facilitate fabrication of the magnet, it is desirable to reduce the number of spools. Therefore, as the coils 4 and 5 of FIG. 10, coils having a substantially identical inner diameter are usually wound around an identical spool. In accordance with the present invention, the coils, such as the coils 4 and 5, which have a substantially identical inner diameter, a substantially identical central radius or a substantially identical outer diameter, as seen in their sectional views, are referred to as coils forming an identical layer.

In order to generate a uniform magnetic field at a central part of the magnet where a sample is inserted, it is necessary to use coils, which generate a magnetic field in a direction reverse from that of the main magnetic field, as the coils for constituting the innermost layer in the split type magnet of the present invention. The reasons for such a requirement will be explained hereinafter.

Figure 12:
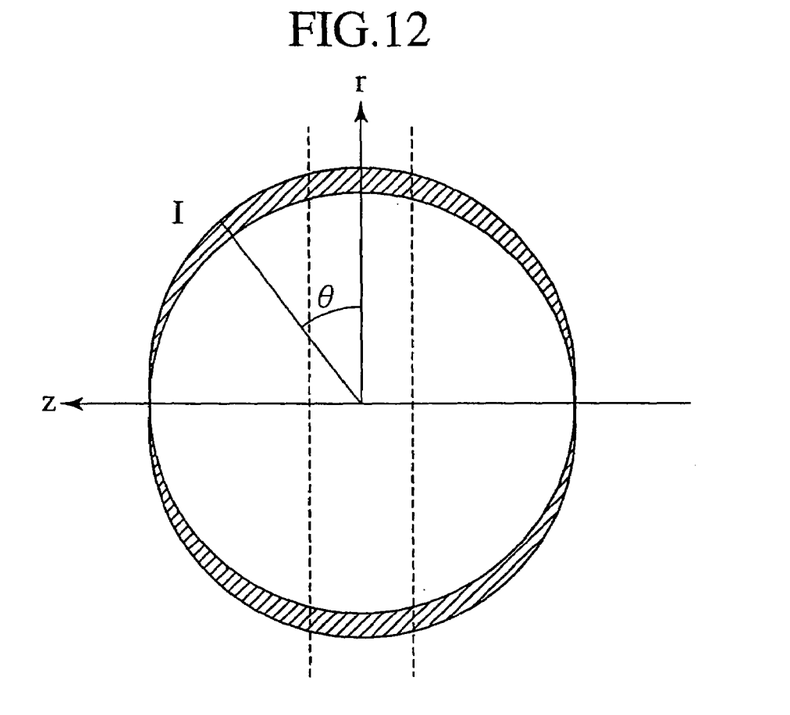
FIG. 12 is a diagram, for the purpose of illustrating an effect of the present invention, showing a two-dimensional axisymmetrical distribution of currents.

FIG. 12 is a sectional view showing a two-dimensional axisymmetrical distribution of currents. As is well-known, a uniform magnetic field is generated in an inner space of the current distribution by setting a current I(θ) of an angle θ, when the center axis is the z axis, to be a so-called cosine θ distribution, as represented by the following expression.

$$I(\theta) = A \cos(\theta)$$

Figure 13:
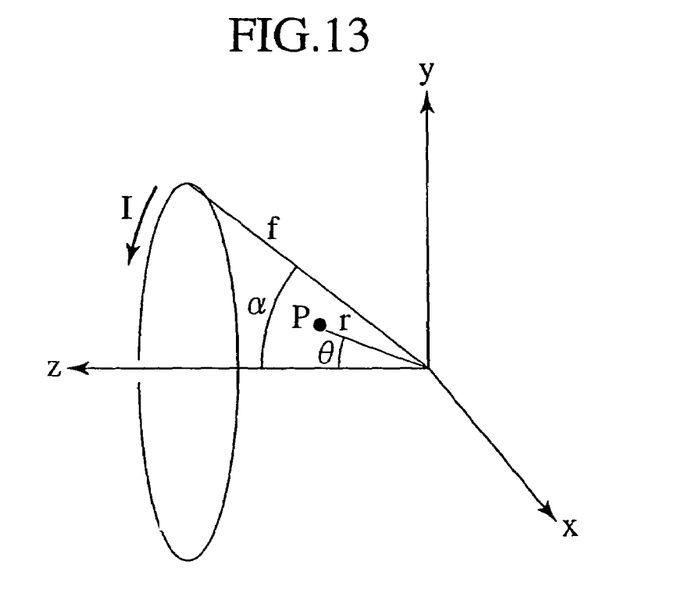
FIG. 13 is a diagram, for the purpose of illustrating an effect of the present invention, showing a positional relationship between the current I which is represented by the position (f,α) and r,θ.

In the above expression, A is a proportional constant. Generation of a uniform magnetic field by the use of a limited number of coils means discretization of the current distribution shown in FIG. 12. However, as can be understood qualitatively, it is difficult to discretize the currents in a region between the two dotted lines of FIG. 12 outside the region through the discretization of the unidirectional current distribution of FIG. 12 using split type coils. It is possible to overcome this difficulty by using expressions for the magnetic field generated by an annulus current, as follows referring to FIG. 13, an X axis and a Y axis show a plane on which Z=0. It is possible to represent the z component of a magnetic field having axes X, Y and Z, which is generated at the point P (r, θ), where r and θ are spherical coordinates, in an inner region of a sphere formed by the inscribing of the annulus current I to the annulus ring, as shown in FIG. 13, by the following expressions.

$$B_z = \sum_{n=0}^{\infty} A_n r^n P_n(\cos\theta)$$

$$A_n = \frac{\mu_0 I}{2f^{n+1}} \sin\alpha P_{n+1}^1(\cos\alpha)$$

In the above expressions, $A_n$ represents the intensity of the n-th order magnetic field. As shown in FIG. 13, for example θ and α represent angles and r and f represent distances Since the magnet of the present invention is mirror-symmetrical with respect to the center plane, only the even-order magnetic fields should be considered due to the symmetry. It is possible to generate a uniform magnetic field by setting a sum of the second-order irregular magnetic fields to zero.

Figure 14:
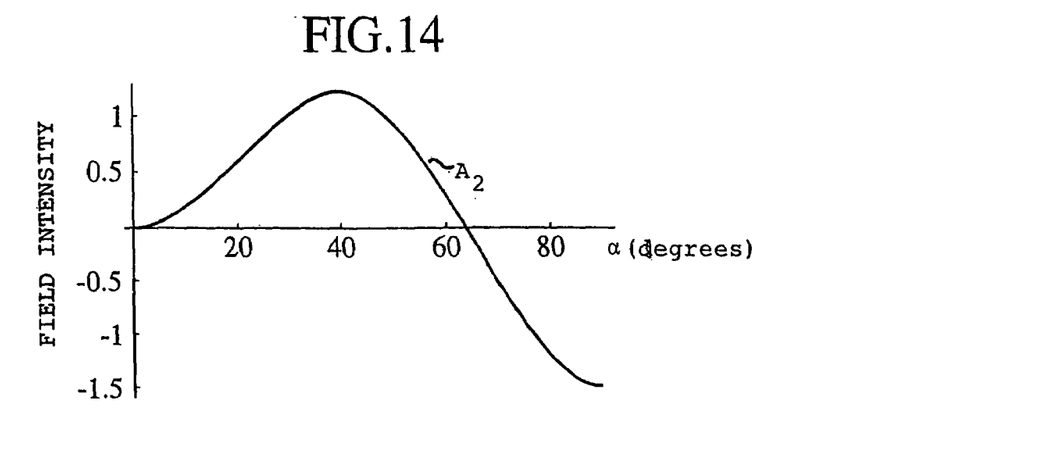
FIG. 14 is a graph showing, for the purpose of illustrating an effect of the present invention, a relationship between a second-order irregular magnetic field generated by the current I, which is represented by the position (f,α) and the angle α.
Figure 15:
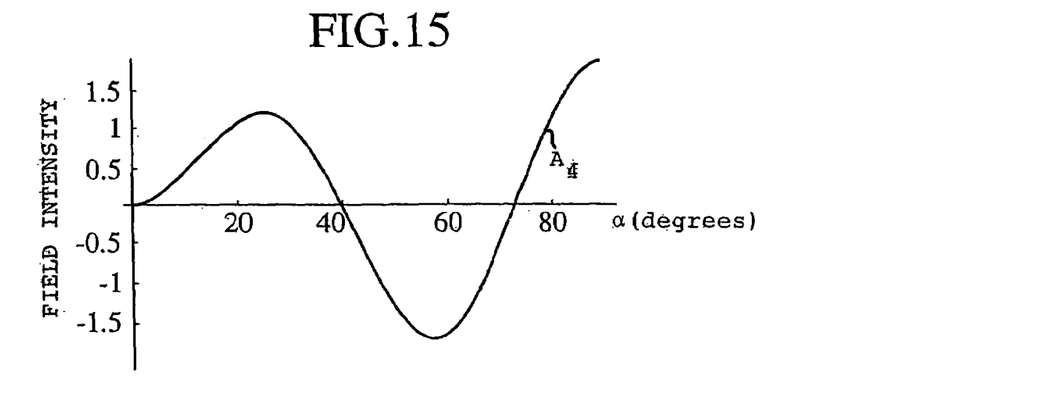
Figure 16:
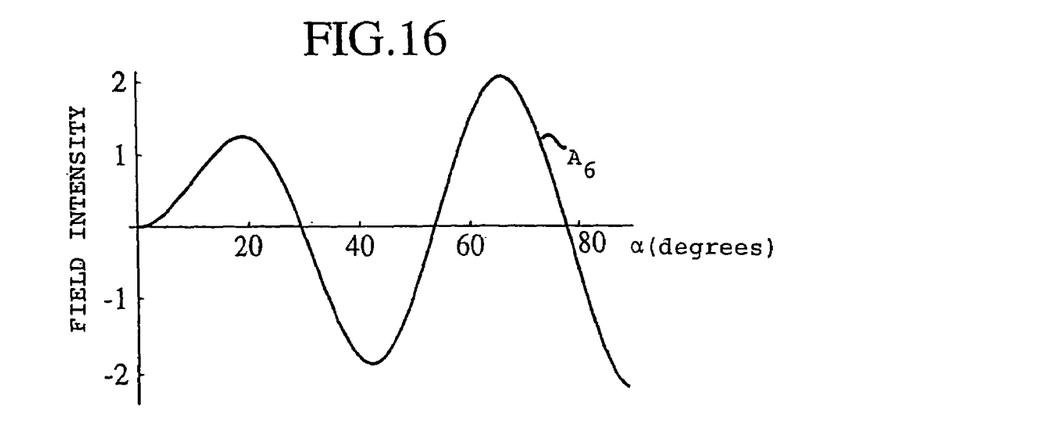
FIG. 16 is a graph showing, for the purpose of illustrating an effect of the present invention, a relationship between a sixth-order irregular magnetic field generated by the current I, which is represented by the position (f,α) and the angle α.

FIGS. 14 to 16 show graphs, in each of which the magnetic field intensity ($A_2$, $A_4$, and $A_6$, respectively) is plotted with respect to α (degrees). In the graphs, it is indicated that $\mu_0 I/2/f^{n+1}=1$. As shown in FIGS. 15 and 16, since each of the higher-order magnetic fields takes positive and negative values with respect to α, the sum of the magnetic fields of all the coils can readily be set to zero, if the arrangement and magnetomotive forces of the discrete coils are properly set. In turn, the second-order magnetic field shown in FIG. 14 becomes zero when tanα=2. This position is well-known as a Helmholtz coil. As is apparent from FIG. 14, when α is smaller than the a of tanα=2 (about 63.4 degrees), the second magnetic field takes only a positive value. As is apparent from FIGS. 1, 2, and 10, since almost all of the coils are placed at positions where a is smaller than the above-described a (about 63.4 degrees), in the split type coil arrangement, it is impossible to set the total of second-order irregular magnetic fields generated by the coils having a current in the direction (positive direction) identical with that generating the main magnetic field to zero. Therefore, it is necessary to use coils having a current in a direction reverse (negative direction) to that generating the main magnetic field, and it is desirable that a portion at which the coils are to be arranged be such that the radius of each of the coils is smaller than those of other coils. The reasons for the desired arrangement will be explained hereinafter. The intensity of an irregular magnetic field generated by the annulus current I, which is shown in FIG. 13, is inversely proportional to $f^{n+1}$ according to the above-identified expressions. Therefore, a smaller radius of the annulus current is more advantageous for generating $A_0$, i.e., a negative second-order irregular magnetic field, without impairing the intensity of the main magnetic field. In principle, it is possible to set the second-order irregular magnetic field to zero by the use of negative current coils having a large radius; however, in view of the above reasons, such negative current coils are unrealistic as means for forming the high magnetic field generating magnet, which is the subject of the present invention, since they reduce the intensity of the main magnetic field. In view of the above reasons, negative-direction current coils are necessarily used for the coils which form the innermost layer, i.e., the coils having an inner diameter, a central radius or an outer diameter, as seen in their sectional views.

BRIEF DESCRIPTION OF THE DRAWINGS

Other objects and advantages of the present invention will become apparent from the following description of various embodiments with reference to the accompanying drawings, in which:

FIG. 15 is a graph showing, for the purpose of illustrating an effect of the present invention, a relationship between a fourth-order irregular magnetic field generated by the current I, which is represented by the position (f,α) and the angle a.

DETAILED DESCRIPTION OF THE PREFERRED EMBODIMENTS

Figure 11:
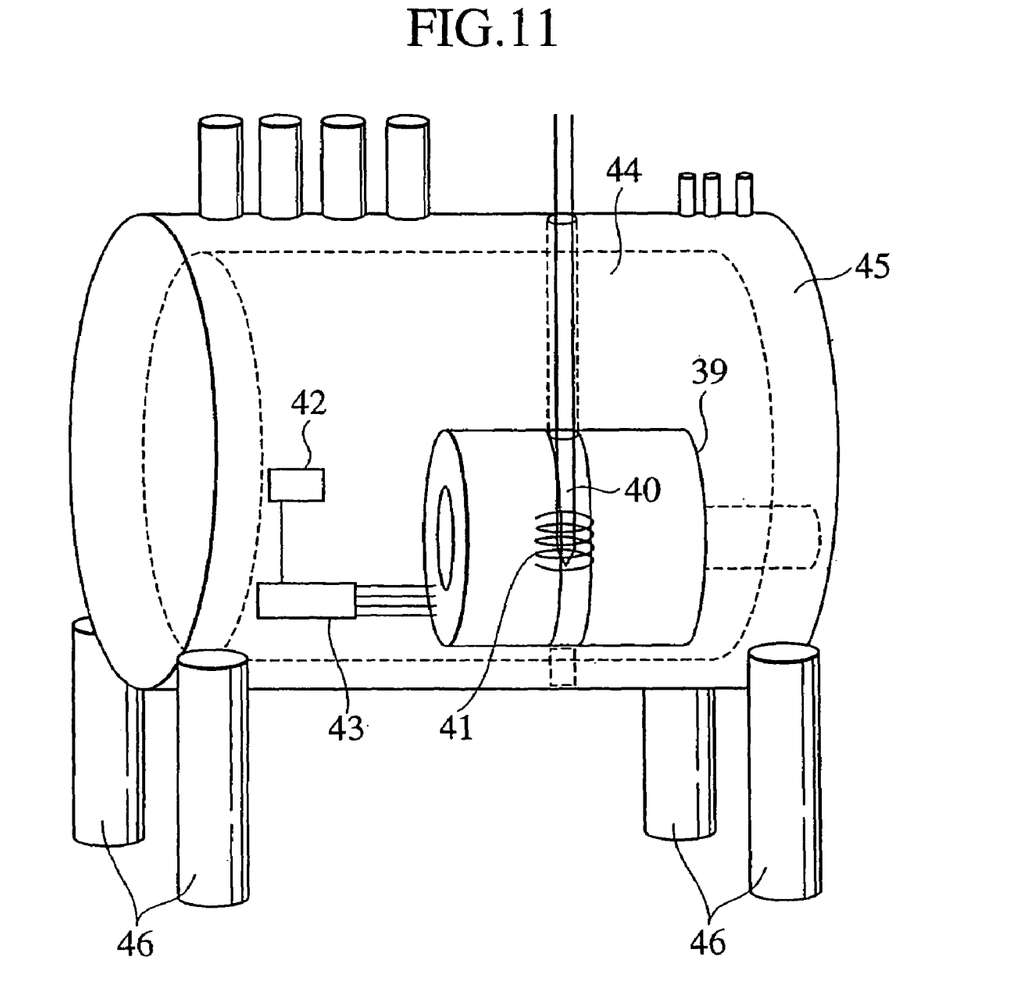
FIG. 11 is a diagram showing the NMR apparatus of the present invention.

Specific embodiments of the present invention will be described hereinafter. FIG. 11 is a diagram showing an NMR apparatus using a split type magnet. A superconducting magnet 39, which is formed of split coils, is installed with a virtual central axis thereof extending along a substantially horizontal direction. A protein sample 40 is inserted into the apparatus from above, and a uniform static magnetic field is applied, from the horizontal direction, to the protein sample 40. Since a solenoid coil 41 is used for receiving an NMR signal, SN ratio is improved by 40% as compared with that achieved by the conventional method, wherein a saddle-like or a birdcage solenoid coil is used, as mentioned in the foregoing. The superconducting magnet 39 is maintained at a permanent current mode by using a permanent current switch 42. The coils constituting the superconducting magnet 39 are connected with one another, with the superconductive state being maintained by a superconducting connection 43. The superconducting magnet 39 is cooled and kept at a low temperature by liquid helium stored in a liquid helium tank 44. The helium tank 44 is surrounded by a liquid nitrogen tank 45 to establish a dual structure made up of the helium tank 44 and the nitrogen tank 45, so that evaporation of the liquid helium is suppressed. The NMR apparatus as a whole is supported by vibration proof supports 46.

Figure 1:
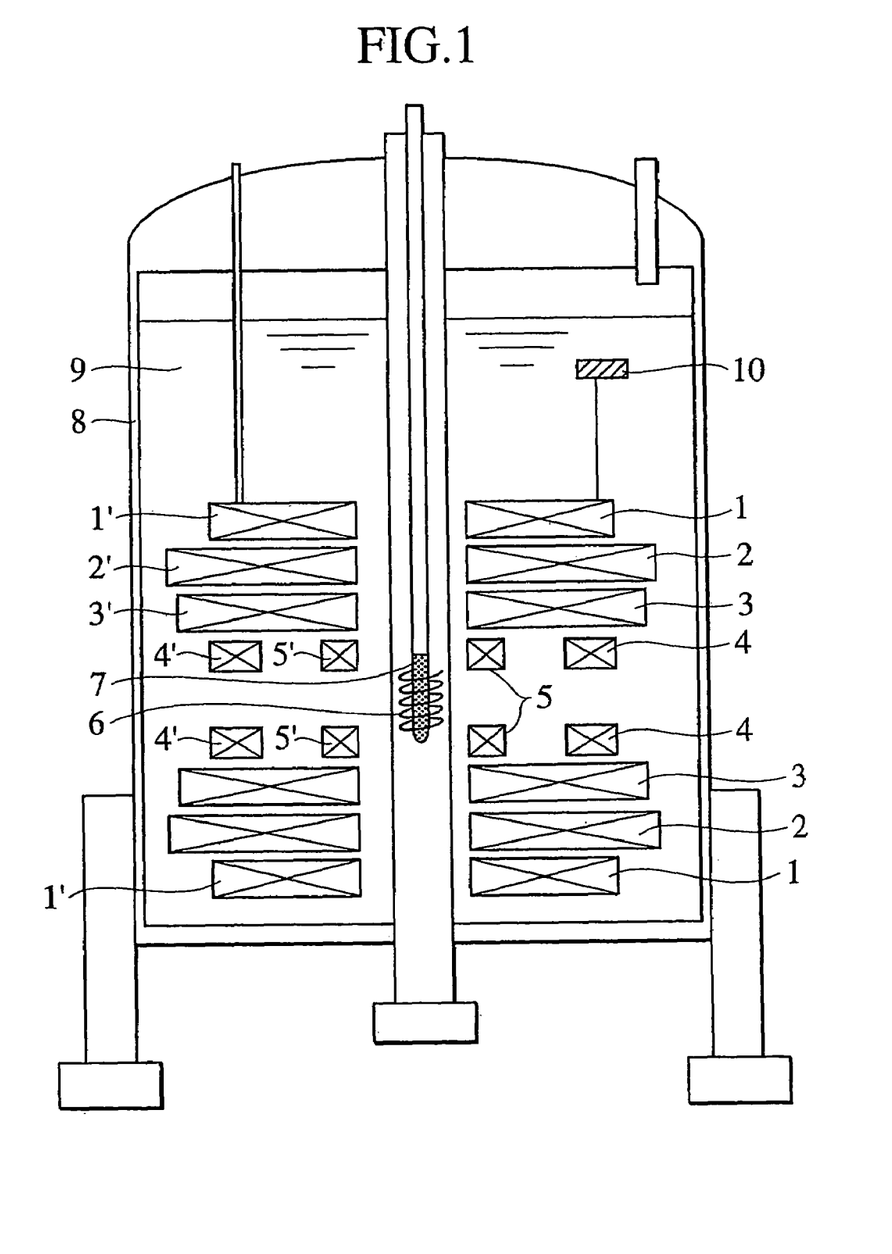
FIG. 1 is a sectional view schematically showing an NMR apparatus according to a first embodiment of the present invention.

FIG. 1 is a sectional view showing the superconducting magnet of the NMR apparatus according to the present invention, and FIG. 10 is a sectional perspective view of the superconducting coils. Each of the superconducting coils 1 to 5 is made from a material having a high superconducting critical magnetic field. The closer the coils are to the sample 7, the higher will be the superconducting critical magnetic field. A protein sample 7 is inserted from above so as to be placed upright at the center portion of the magnetic field, and the magnetic field is applied to the sample from lateral directions.

Each of the superconducting magnets consists of a pair of left and right coils which are arranged symmetrically, and each of the coils is wound about a horizontal axis in a solenoidal fashion. Throughout the drawings, the left coils are designated by the same reference numerals as the right coils with the addition of a prime (') so that, for example, the right coil 1 and the left coil 1' from part of the pair of left coils 1'-5' and the right coils 1-5. A solenoid coil 6 which is made from copper and is maintained at an ordinary temperature, or a solenoid coil 6 which is Y-based or made from $MgB_2$ and cooled to 10 to 20 K, is used for NMR signal detection. The superconducting magnets are set to a permanent current mode by a permanent current switch 10, and the time fluctuation of the magnetic field is adjusted to be 0.5 Hz per hour or less.

The superconducting magnets are immersed in liquid helium 9 and maintained at a low temperature. A gap between the container containing the liquid helium 9 and the outer housing is filled with liquid nitrogen 8, so that the dual structure formed of the liquid helium 9 and the liquid nitrogen 8 contributes to conserving helium.

Each of the left and right superconducting coils of the present embodiment has a horizontal central axis and is in substantially concentric relation with respect to the horizontal central axis and generates a horizontal magnetic field. The superconducting coils are arranged to be multilayered, and the left and right superconducting coils in each of the layers are substantially mirror-symmetrical with each other with respect to a center face extending along the vertical direction of the magnet device. The direction of a current flowing through the superconducting coils 5 and 5', which form the innermost layer, together with the superconducting coils 4 and 4', is reverse to that of the currents of the other superconducting coils. More specifically, the direction of the magnetic field generated in the sample area by the superconducting coils 5 and 5' is opposite to the main direction of the magnetic field generated by the other superconducting coils. Owing to this structure, the split type magnet device, as shown, generates a remarkably uniform magnetic field whose uniformity is the same as or superior to that generated by conventional multilayer solenoids.

The foregoing description is a summary of the NMR system using a magnet having a split coil structure according to the present invention. Only the structure of a superconducting coil of the NMR system is described in each of the following embodiments.

Figure 2:
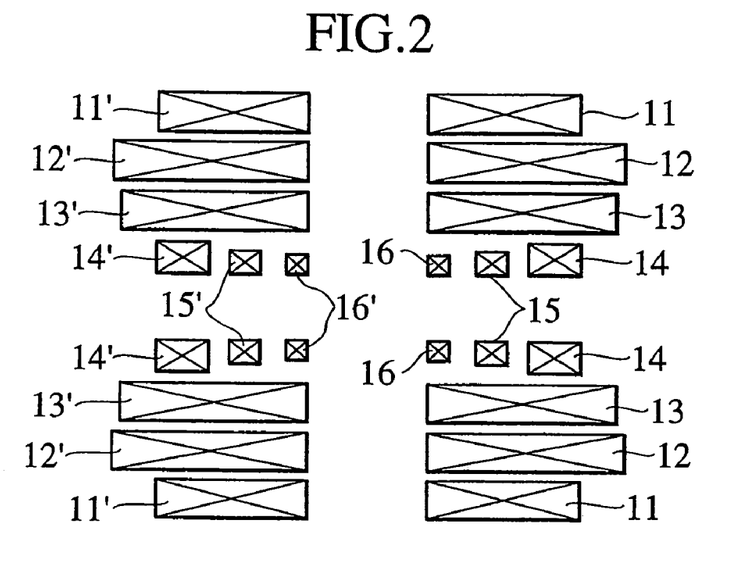
FIG. 2 is a sectional view schematically showing an arrangement of coils of a split type magnet device according to a second embodiment of the present invention.

An arrangement of superconducting coils, according to a second embodiment of the present invention, is shown in FIG. 2. Each of the pairs of (left and right) superconducting coils 11 to 16 and 11' to 16' (ex., the pair of 11 and 11') is arranged so as to be substantially concentric with respect to a central axis extending along the horizontal direction. The left and right multilayer superconducting coils are arranged substantially symmetrically with respect to a center face extending along the vertical direction of the magnet device, and a certain distance is maintained between the centerline and each of the multilayer superconducting coils. The superconducting coils 14, 15, and 16 form the innermost layer, wherein the superconducting coils 15 and 15' are energized in such a manner that the magnetic field generated thereby is in a direction reverse to that generated at the central part. Thus, a magnetic field of ppb-order uniformity is formed at the center portion of the split type magnet device of the present embodiment.

Figure 3:
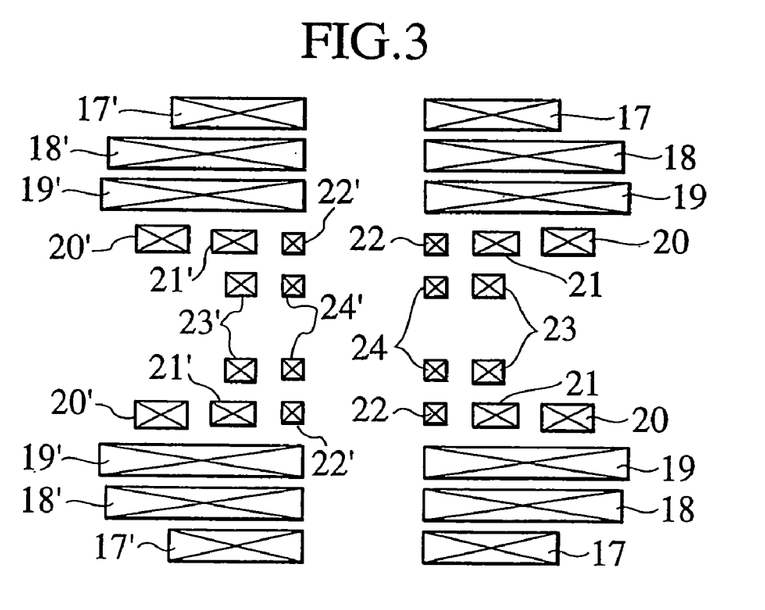
FIG. 3 is a sectional view schematically showing an arrangement of coils of a split type magnet device according to a third embodiment of the present invention.

An arrangement of superconducting coils, according to a third embodiment of the present invention, is shown in FIG. 3. Each of the pairs of (left and right) superconducting coils 17 to 24 and 17' to 24' (ex., the pair of 17 and 17') is arranged substantially concentric with respect to a central axis extending along the horizontal direction. The left and right multilayer superconducting coils are arranged substantially symmetrically with respect to a center face extending along the vertical direction of the magnet device, and a certain distance is maintained between the center face and each of the multilayer superconducting coils. Among the layers formed by the pairs of (left and right) superconducting coils, the innermost layers are formed of the superconducting coils 23, 23', 24 and 24', and layers disposed radially outward from the innermost layers are formed of the superconducting coils 20, 20', 21, 21', 22 and 22'. The pair of superconducting coils 22 and 22' and the pair of superconducting coils 23 and 23' are energized in such a manner as to generate a magnetic field which is in a direction reverse to that generated at the central part. Thus, a magnetic field of a ppb-order uniformity is formed at the center portion of the split type magnet device of the present embodiment.

The NMR apparatus should desirably have a small leakage magnetic field; and, therefore, a fourth embodiment, which will described hereinafter, includes a shielding of the leakage magnetic field.

Figure 4:
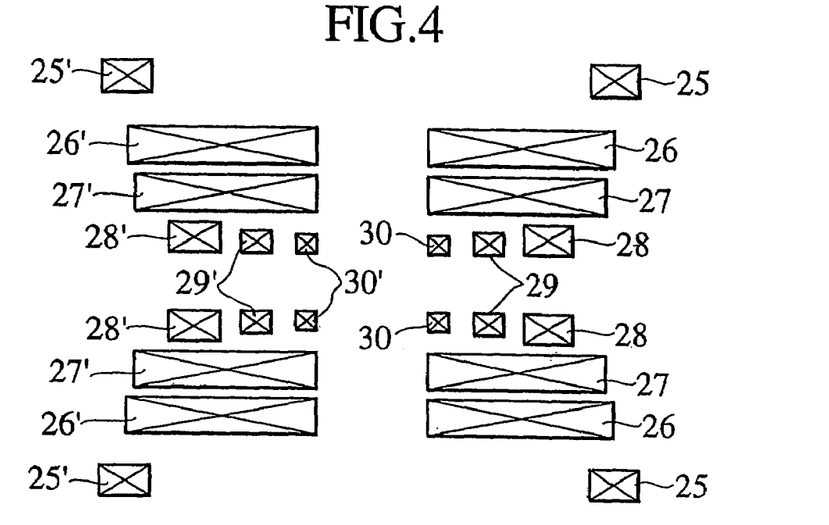
FIG. 4 is a sectional view schematically showing an arrangement of coils of a split type magnet device according to a fourth embodiment of the present invention.

An arrangement of superconducting coils according to the fourth embodiment of the present invention is shown in FIG. 4. Superconducting coils 26 to 30 and 26' to 30' generate a uniform magnetic field at the center portion of the magnet device. In the present embodiment, the superconducting coil 30 and 30' are energized to generate a magnetic field which is in a direction reverse to that generated by the other coils, so that a magnetic field of ppb-order uniformity is generated. Superconducting shielding coils 25 and 25' are active shielding coils used for suppressing the leakage of the magnetic field.

Figure 5:
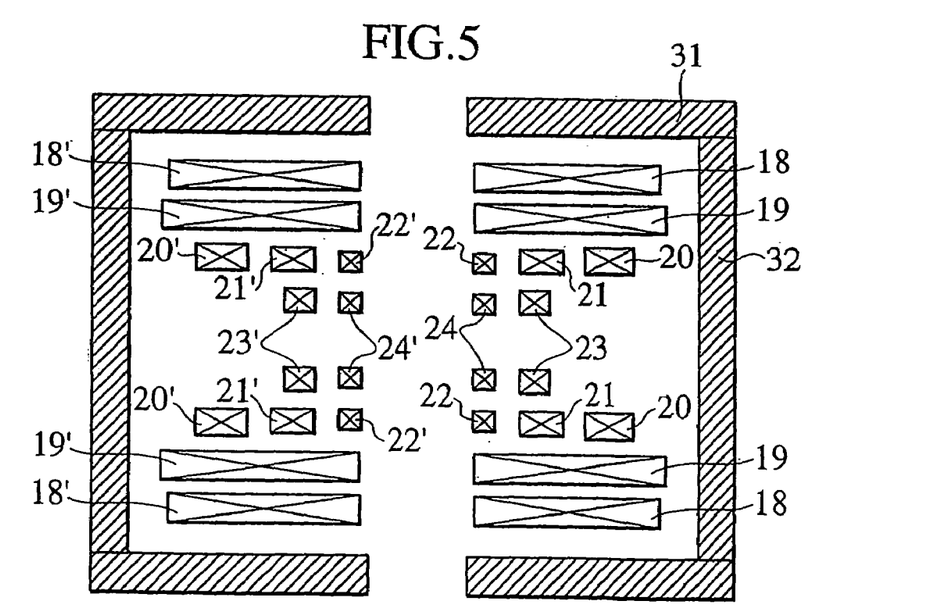
FIG. 5 is a sectional view schematically showing an arrangement of coils of a split type magnet device and a ferromagnetic member for shielding leakage magnetic field according to a fifth embodiment of the present invention.

An arrangement of superconducting coils and a ferromagnetic member for shielding the leakage magnetic field, according to a fifth embodiment of the present invention, are shown in FIG. 5. A cylindrical ferromagnetic member 31 and a disk-like ferromagnetic member 32 form magnetic paths to inhibit a magnetic field, which is generated by the superconducting coils 18-24,18'-24', from leaking to the outside.

Figure 6:
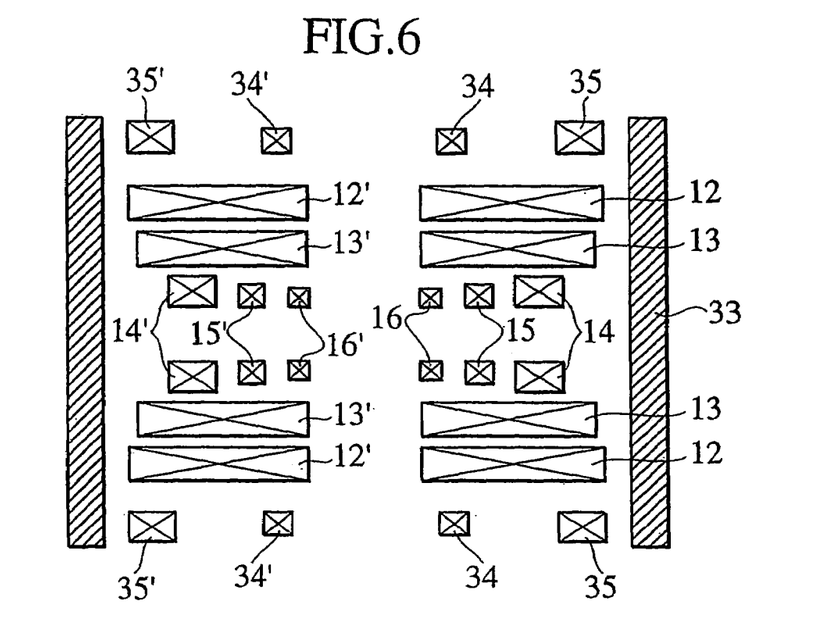
FIG. 6 is a sectional view schematically showing an arrangement of coils of a split type magnet device and a ferromagnetic member for shielding leakage magnetic field according to a sixth embodiment of the present invention.

An arrangement of superconducting coils 12-16, 12'-16' and a ferromagnetic member for shielding the leakage magnetic field, according to a sixth embodiment of the present invention, are shown in FIG. 6. Superconducting shield coils 34-35 and 34'-35' inhibit the magnetic field from leaking radially outward, while the disk-like ferromagnetic member 33 inhibits the magnetic field from leaking along the axial direction.

Figure 7:
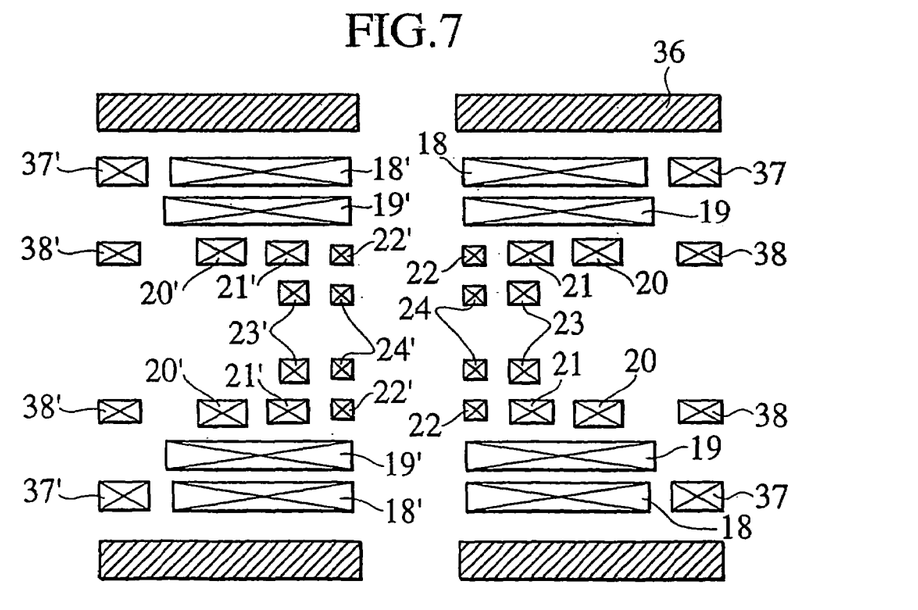
FIG. 7 is a sectional view schematically showing an arrangement of coils of a split type magnet device and a ferromagnetic member for shielding leakage magnetic field according to a seventh embodiment of the present invention.

An arrangement of superconducting coils and a ferromagnetic member for shielding the leakage magnetic field, according to a seventh embodiment of the present invention, are shown in FIG. 7. Superconducting shield coils 37 and 38 and 37' and 38' inhibit the magnetic field from leaking along the axial direction, while a cylindrical ferromagnetic member 36 inhibits the magnetic field from leaking radially.

Although all of the coils 18-24 and 18'-24' constituting the magnet device are superconducting coils throughout the foregoing embodiments, the present invention is not limited to the foregoing embodiments, and the coils may be those which can carry a current, such as a coil fabricated by winding a copper wire. Further, a permanent magnet may be used as a source of the magnetomotive force for the static magnetic field source.

Various embodiments of the present invention are possible, as described above; however, the invention is not limited to the embodiments described in this specification.

According to the present invention, the NMR apparatus for solution analysis using a split type magnet device can generate a magnetic field of ppb-order uniformity in a detection space. Since it is possible to insert a solenoid type probe coil into the magnetic field using a split gap of the magnet device, even an apparatus of 800 MHz can achieve a SN detection sensitivity equivalent to that of a conventional 1 GHz NMR apparatus. Further, since the intensity at the center portion of the magnetic field is relatively low, it is possible to shield the leakage magnetic field, thereby remarkably improving the installability of the apparatus.

What is claimed is:

1. A superconducting magnet configured for an NMR spectrometer, which comprises;
    a split type superconducting magnet comprising left solenoid superconducting magnets and right solenoid superconducting magnets, the split type superconducting magnet having a center space between the left solenoid superconducting magnets and the right solenoid superconducting magnets configured for receiving a sample tube;
    a permanent current switch configured for holding the split type superconducting magnet in a permanent current mode; wherein the left solenoid superconducting magnets and the right solenoid superconducting magnets are arranged symmetrically with respect to a center face of the center space;
    wherein the left solenoid superconducting magnets are constituted by an outermost magnet and a plurality of innermost magnets;
    wherein the right solenoid superconducting magnets are constituted by an outermost magnet and a plurality of innermost magnets;
    wherein the left solenoid superconducting magnets and the right solenoid superconducting magnets are arranged in concentric relation with respect to a vertical axis of the center space; and
    wherein a direction of current in at least one of the plurality of innermost magnets is minus when a direction of current in the outermost magnet of at least one of the right and left solenoid superconducting magnets is plus.

2. The superconducting magnet according to claim 1, wherein the left solenoid superconducting magnet and the right solenoid superconducting magnets are arranged with respect to a horizontal axis perpendicularly intersecting the vertical center axis.

3. The superconducting magnet according to claim 1, wherein an intensity of a magnetic field in the center space is at least 14 T.

4. The superconducting magnet according to claim 1, wherein an intensity of a magnetic field in the center space is at least 21 T.

5. A superconducting magnet comprising:
    a split type superconducting magnet comprising left solenoid superconducting magnets and right solenoid superconducting magnets, the split type superconducting magnets having a center space between the left solenoid superconducting magnets and the right solenoid superconducting magnets configured for receiving a sample tube;
    a permanent current switch configured for holding the split type superconducting magnet in a permanent current mode;
    wherein the left solenoid superconducting magnets and the right solenoid superconducting magnets are arranged symmetrically with respect to a center face of the center space;
    wherein the left solenoid superconducting magnets and the right solenoid superconducting magnets are constituted by an outermost magnet and a plurality of innermost magnets;
    wherein the plurality of innermost magnets of the left solenoid superconducting magnets and the plurality of the innermost magnets of the right solenoid superconducting magnets are arranged symmetrically with respect to the center face of the center space;
    wherein the left solenoid superconducting magnets and the right solenoid superconducting magnets are arranged in concentric relation with respect to a horizontal axis of the center space; and
    wherein a direction of current flowing through the innermost magnets is reverse to a direction of current flowing through the outermost magnet of at least one of the right and left solenoid superconducting magnets.

6. The superconducting magnet according to claim 5, wherein the left solenoid superconducting magnet and the right solenoid superconducting magnets are arranged with respect to a horizontal axis perpendicularly intersecting a vertical center axis of the center space.

7. The superconducting magnet according to claim 5, wherein the center space extends vertically.

8. The superconducting magnet according to claim 5, wherein an intensity of a magnetic field in the center space is at least 14 T.

9. The superconducting magnet according to claim 5, wherein an intensity of a magnetic field in the center space is at least 21 T.

* * * * *